United States Patent
Khoini-Poorfard et al.

(10) Patent No.: US 7,623,601 B2
(45) Date of Patent: Nov. 24, 2009

(54) CONTROLLING GAIN IN A SATELLITE RECEIVER

(75) Inventors: Ramin Khoini-Poorfard, Austin, TX (US); David Trager, San Marcos, TX (US)

(73) Assignee: Silicon Laboratories Inc., Austin, TX (US)

( * ) Notice: Subject to any disclaimer, the term of this patent is extended or adjusted under 35 U.S.C. 154(b) by 632 days.

(21) Appl. No.: 11/247,477

(22) Filed: Oct. 11, 2005

(65) Prior Publication Data

US 2007/0081615 A1 Apr. 12, 2007

(51) Int. Cl.
H04L 27/08 (2006.01)
(52) U.S. Cl. ..................................... 375/345
(58) Field of Classification Search ................. 375/345
See application file for complete search history.

(56) References Cited

U.S. PATENT DOCUMENTS

2005/0141656 A1* 6/2005 Choi .......................... 375/345
2006/0062324 A1* 3/2006 Naito et al. ................. 375/296

OTHER PUBLICATIONS

U.S. Appl. No. 11/261,201, filed Oct. 28, 2005, entitled "Performing Blind Scanning in a Receiver" by Junsong Li; Yan Zhou.

* cited by examiner

Primary Examiner—Mohammad H Ghayour
Assistant Examiner—Tanmay K Shah
(74) Attorney, Agent, or Firm—Trop, Pruner & Hu, P.C.

(57) ABSTRACT

In one embodiment, the present invention includes a method for digitally detecting a first signal strength corresponding to a multi-channel spectrum of an incoming radio frequency (RF) spectrum and digitally detecting a second signal strength corresponding to a selected channel of the incoming RF spectrum. Based on these values, one or more one gain stages of a receiver, such as a satellite television receiver for the incoming RF spectrum, may be controlled. Other embodiments are described and claimed.

15 Claims, 7 Drawing Sheets

CONTROLLING GAIN IN A SATELLITE RECEIVER

FIELD OF THE INVENTION

The present invention relates generally to controlling gain in a receiver, and more particularly to controlling gain in a satellite receiver.

BACKGROUND

Receivers are used in many applications to receive incoming radio frequency (RF) signals and convert them to baseband signals for desired processing. Various such receivers exist including cellular receivers, radio receivers, satellite receivers such as television satellite receivers, among many others.

A receiver is typically coupled to receive incoming RF signals from an antenna and process these signals in various stages, including amplification stages, filtering stages, down conversion stages, and the like. In many systems, received signals are of a very low power and accordingly must be amplified before further processing can occur. However, if signals are amplified too much, distortion may occur. Such distortion may include clipping in an analog-to-digital converter (ADC) of a receive path. If insufficient amplification is provided, signals of interest may be lost within the quantization noise of the ADC. Accordingly, many systems implement gain control in various manners. Some systems implement automatic gain control (AGC), which is often accomplished via an AGC algorithm.

A conventional AGC algorithm in a satellite receiver is typically based on a single power detector whose result will set the gain for the RF and baseband chains. This algorithm, however, is suboptimal for certain RF spectrum profiles. The most common AGC algorithm found in satellite receivers is based on a detector that is located at the output of a baseband ADC. The bandwidth of the filter in front of the ADC is usually tuned such that only the wanted channel is passed. As such, the detector is only exposed to the wanted channel power and is oblivious to the strength of adjacent channels.

While this scheme works well for satellite spectral profiles that have equal power channels, it is insufficient for degenerate cases where the wanted channel is different than the rest of the channels. For example, where the wanted channel is weaker than other received channels, the AGC algorithm will measure the power of the wanted channel and will set the gain as if all the channels are of equal power. But since in this case the rest of channels are stronger (e.g., "x" dB) than the wanted channel, the multi-tone power ratio (MTPR), which is the cumulative intermodulation distortion of all these other channels, will increase e.g., by "2X" dB, hence deteriorating performance of the desired channel considerably. A need thus exists for improved gain control.

SUMMARY OF THE INVENTION

In one aspect, the present invention includes a method for digitally detecting a first signal strength corresponding to a multi-channel spectrum of an incoming radio frequency (RF) spectrum, digitally detecting a second signal strength corresponding to a selected channel of the incoming RF spectrum, and controlling at least one gain stage based on the first and second signal strengths. The signal strengths may correspond to average power levels of the signals, which may be received in a tuner, for example, of a satellite television receiver.

In another aspect, an apparatus may include an analog receiver path to receive an incoming RF signal spectrum and to generate a multi-channel conditioned signal from the spectrum. The apparatus may further include a digital receiver path coupled to the analog receiver path to process the multi-channel conditioned signal to obtain a single channel digital signal, along with multiple power detectors. Specifically, the apparatus may have a first power detector coupled to measure a first power level corresponding to the multi-channel conditioned. signal and a second power detector coupled to measure a second power level corresponding to the single channel digital signal. Still further, the apparatus may include a controller to control at least one gain stage of the apparatus based on the first and second power levels. In this manner, improved performance may be achieved in the presence of a signal spectrum in which multiple received channels (e.g., adjacent channels) have different power levels.

An apparatus consistent with that described above may be implemented in a system such as a receiver system that includes a low-noise amplifier (LNA) to couple to an input signal source. The LNA may be coupled to a mixer to provide I and Q channel signals which may be processed in I and Q channel paths. At different stages of these I and Q channel paths such as at a wideband portion and a narrowband portion, signal strengths may be measured and used to control a gain of the LNA (for example) and/or one or more other gain stages. Such control may be performed via a controller, such as a digital signal processor (DSP).

DETAILED DESCRIPTION

Figure 1:
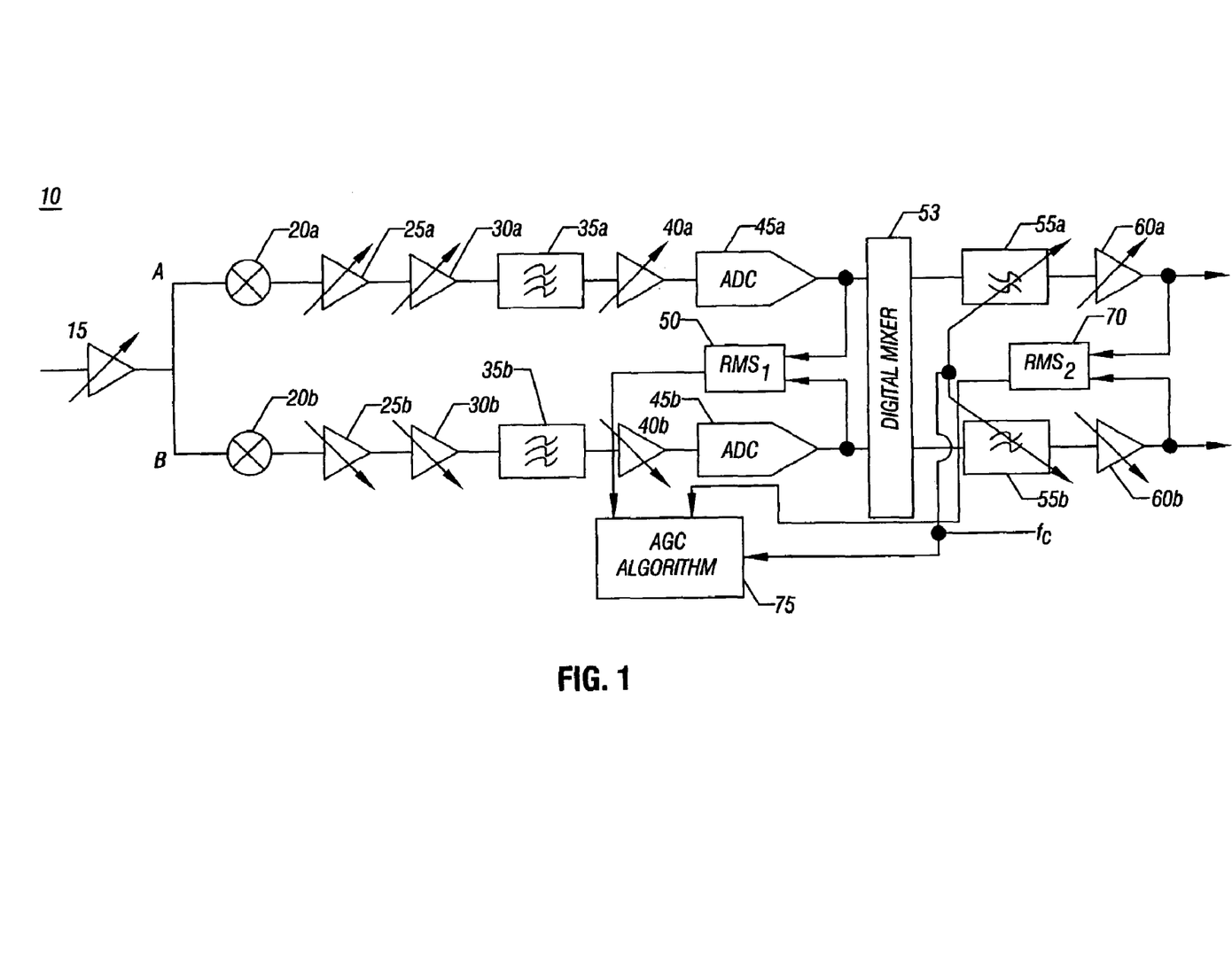
FIG. 1 is a block diagram of a portion of a receiver in accordance with one embodiment of the present invention.

Referring now to FIG. 1, shown is a block diagram of a portion of a receiver in accordance with one embodiment of the present invention. As shown in FIG. 1, a receiver portion 10 is adapted to receive incoming signals, for example, radio frequency (RF) signals. As one example, incoming signals may be an RF spectrum, for example, of a direct broadcast system (DBS) satellite service, satellite radio, or another RF system. As shown in FIG. 1, incoming signals are received and amplified by a low noise amplifier (LNA) 15. The output of LNA 15 is coupled to a first channel and a second channel, namely an in-phase (I) channel A and a quadrature-phase (Q) channel B. For ease of explanation, the receive path with regard to the in-phase signals will be discussed. However, as shown in FIG. 1, similar circuitry is present in the quadrature-phase path.

Thus as shown in FIG. 1, the output of LNA 15 is provided to a mixer 20a, which downconverts the incoming RF signals to an intermediate frequency (IF). While not shown in FIG. 1, it is to be understood that mixer 20a may mix the incoming signal with a received local oscillator (LO) frequency. In different implementations, a mixer may provide for direct down conversion (DDC) or conversion down to an intermediate frequency signal or a low IF signal. In one implementation, the mixer does not mix a desired channel down to a fixed target IF frequency and then mix the desired channel to DC. Rather, this implementation uses analog coarse tune circuitry to mix the desired channel down to a variable location within a frequency range near DC, and then digital conversion and digital filtering is performed directly on this coarsely tuned channel spectrum.

From mixer 20, the IF signal is passed through a plurality of gain stages 25a and 30a. In one embodiment, gain stages 25a and 30a each may be programmable gain amplifiers (PGAs), although the scope of the present invention is not so limited. From gain stage 30a, the received signals are provided to a filter 35a, which may be an analog wideband filter having a bandwidth that may span several channels. For example, filter 35a may be a wideband filter that allows a selected frequency band to be passed. For example, in an implementation for a satellite receiver, filter 35a may have a bandwidth of approximately 85 MHz, although other variations are possible. Furthermore, in some implementations, filter 35a may be a constant corner frequency filter. However, in other implementations a variable frequency filter may be provided instead.

Still referring to FIG. 1, after filtering, the filtered signal is amplified in a third gain stage 40a, which may be another PGA, for example. The amplified signal is then passed to an analog-to-digital converter (ADC) 45a which converts the signal into a digital representation. In various embodiments, ADC 45a may be a pipeline converter, although in other implementations a flash or interpolated flash-type converter may be provided. The gain of receiver portion 10 may be controlled so that the full dynamic range of ADC 45a may be appropriately used. That is, the filtered wideband signals provided to ADC 45a may be at a power level such that they do not exceed the full-scale value of ADC 45a, while at the same time a desired channel within this spectrum is above a quantization noise floor of ADC 45a.

Still referring to FIG. 1, the digitized signal is fine tuned in a digital mixer 53, which may include a numerically controlled oscillator (NCO) (not shown in FIG. 1) that in turn receives a frequency control value (not shown in FIG. 1) to control the amount of fine tuning. After fine tuning, the digitized signal is provided to a digital filter 55a, which may be a narrowband digital filter. In various implementations, filter 55a may be a variable filter controlled to pass only a desired channel, e.g., corresponding to a selected television channel. While the value of the narrowband filter may vary, in a DBS implementation, a selected channel having a frequency of between approximately 1.0 and 30.0 MHz may be passed.

As further shown in FIG. 1, the digitized signal from ADC 45a is provided to a first detector 50, which may be a power detector, for example, a root mean square (RMS) detector, to detect the power of the incoming signals. Specifically, as shown in FIG. 1, first detector 50 is coupled to receive digitized data from both the in-phase path as well as the quadrature-phase path, although in some implementations only the data from a single path may be detected. As will be described further below, the detected power output from first detector 50 (i.e., $RMS_1$) may be provided to an automatic gain control (AGC) algorithm 75, as will be discussed further below.

Still referring to FIG. 1, after being filtered in filter 55a, the digitized data may be amplified in a fourth gain stage 60a, which may be a digital amplifier. The resulting signal is then provided to further processing circuitry of a receiver, for example, demodulation circuitry. As further shown in FIG. 1, the output of fourth gain stage 60a is also provided to a second power detector 70, which may also be an RMS detector, for example. The detected power output from second detector 70 (i.e. $RMS_2$), which may correspond to the narrowband data, e.g., of a single channel, is also provided to AGC algorithm 75 for use as discussed further below.

In many implementations, receiver portion 10 shown in FIG. 1 may be integrated on a single substrate. That is, both analog and digital circuitry of receiver portion 10 may be formed on a single substrate incorporated into an integrated circuit (IC). The digital circuitry may include processing circuitry such as a digital signal processor (DSP), which may perform AGC algorithm 75, in some embodiments. Furthermore, while FIG. 1 shows only a single receiver or tuner, in some embodiments a single substrate may incorporate multiple tuners to allow for simultaneous tuning and processing of multiple selected channels. In such manner, a satellite receiver may tune to a first channel for immediate display on a television or other monitor, while a second tuner may tune to a second channel that is to be stored on a personal video recorder (PVR), for example.

As further shown in FIG. 1, AGC algorithm 75 is further coupled to receive a corner frequency ($f_c$) of both analog filter 35a ($f_c$, analog) and digital filter 55a ($f_c$, digital). As will be described further below, algorithm 75 may be adapted to determine appropriate gain levels for the various gain stages described above based on various information, including the values obtained from first detector 50 and second detector 70, the corner frequencies for digital filter 55a (e.g., the selected channel) and the corner frequency of filter 35a. Based on this information, AGC algorithm 75 may determine an optimal gain setting for the RF channels. In other words, a spectral density of both a plurality of channels and a selected channel may be considered in determining gain levels. The optimum gain setting may be based on a linearity requirement which seeks to maintain linear operation of a receiver over various incoming signal levels, and the dynamic range of the ADC. If a desired dynamic range cannot be maintained, intermodulation distortion and/or clipping can occur.

Consider a first spectral profile of incoming RF energy. For a case where all first RF channels are equal in power, the power levels at the detectors may be related as follows:

$$RMS_2 = RMS_1 \times \sqrt{\frac{fc, digital}{fc, analog}} \qquad [1]$$

Figure 2:
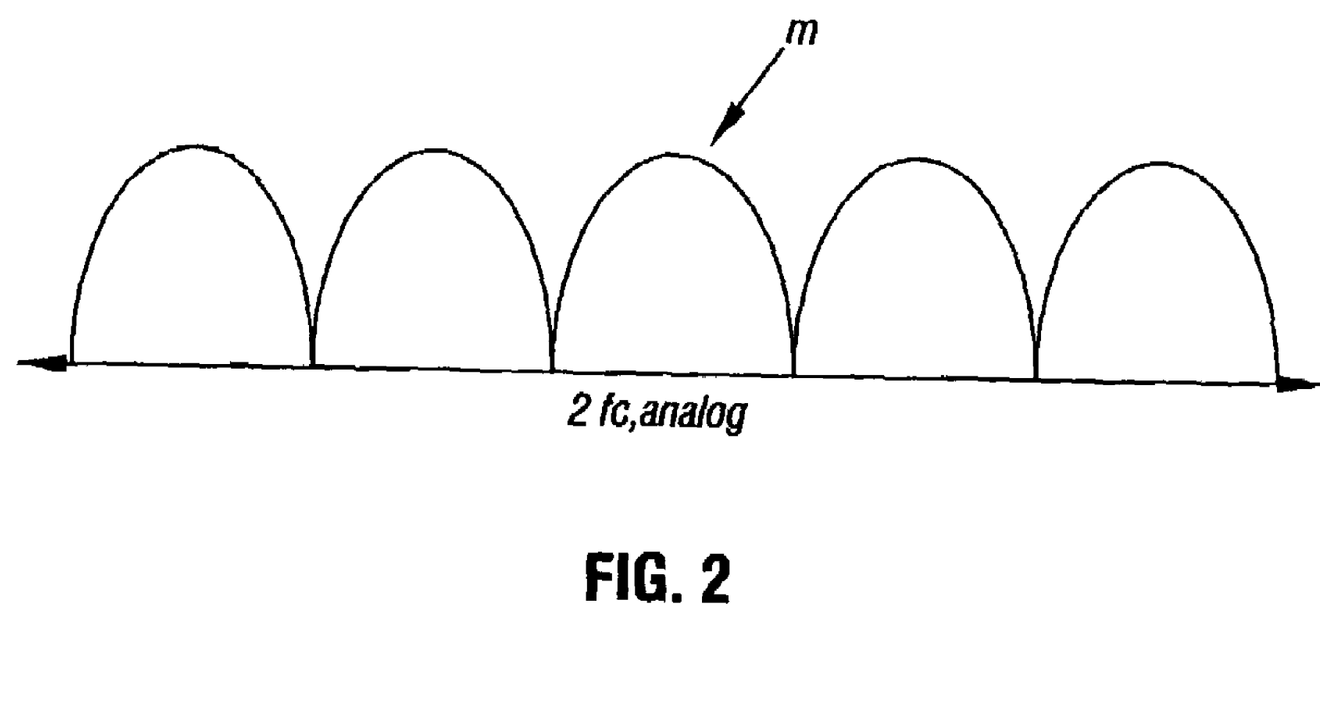
FIG. 2 is a radio frequency (RF) spectrum of first RF signals received by a satellite receiver.

This profile is illustrated in FIG. 2. As shown in FIG. 2, five channels are passed by the wideband filter. Each channel has equal power (and assume for purposes of explanation, equal bandwidths). The selected channel, which is passed by the narrowband digital filter, is shown as the middle channel, M. In this case, the total power of the five channels is five times the selected channel power. Accordingly, the ratio of $RMS_2$ to $RMS_1$ is $1/\sqrt{5}$, and the corresponding corner frequency of the digital filter is ⅕ the corner frequency of the analog filter.

Figure 3:
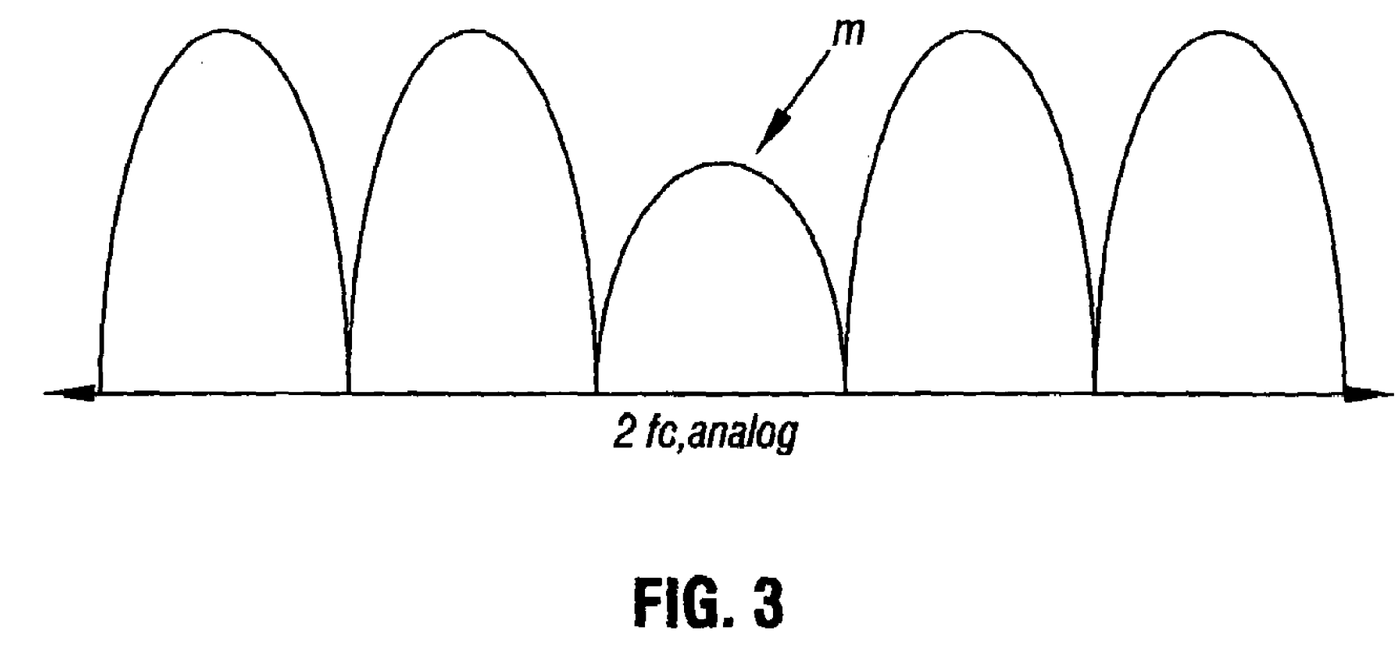
FIG. 3 is a RF spectrum of second RF signals received by a satellite receiver.

If, however, the wanted channel is much weaker than the rest of the channels, as shown in FIG. 3, then the ratio of $RMS_{2\ to\ RMS1}$ is smaller than that of the spectrum shown in FIG. 2 and described by Equation [1]. If the number of channels within the wideband analog filter is large enough, one can approximately derive the ratio between $RMS_2$ and $RMS_1$ as follows:

$$RMS_2 \cong RMS_1 \times \sqrt{\frac{fc, digital}{fc, analog} \times 10^{-x/10}} \quad [2]$$

Hence an AGC algorithm in accordance with an embodiment of the present invention, based on known values for $RMS_1$, $RMS_2$, ($f_c$, digital) and ($f_c$, analog) can estimate the ratio "x" and thus find an optimum gain setting for the RF spectrum. In various implementations, the gain may be set with considerations of a linearity requirement on one hand and the ADC dynamic range on the other hand.

Figure 4:
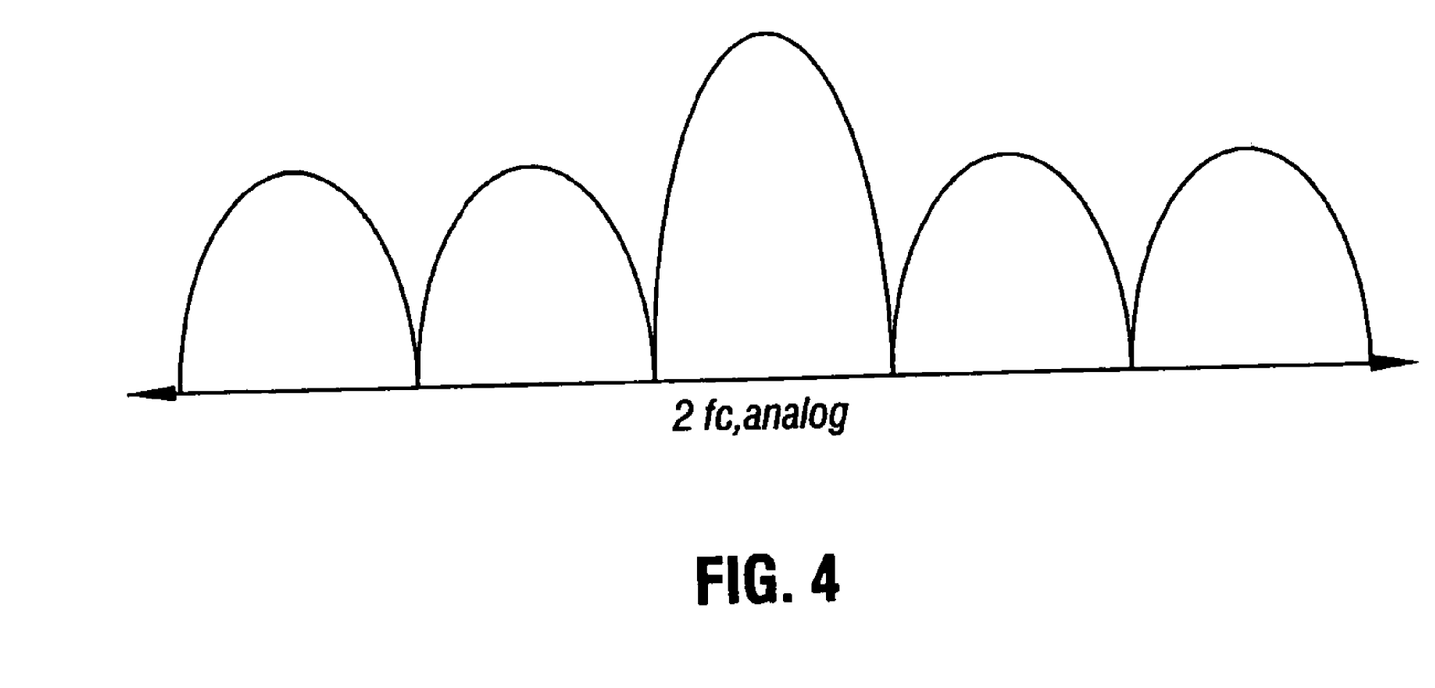
FIG. 4 is a RF spectrum of third RF signals received by a satellite receiver.

Now consider a spectrum where the wanted channel is stronger than the other channels as depicted in FIG. 4. Again for a large enough number of channels within the bandwidth of the wideband analog filter, one can set forth the ratios of the selected RMS values as follows:

$$RMS_2 = \frac{RMS_1}{\sqrt{\left[1 + \frac{fc, analog}{fc, digital} \times 10^{-x/10}\right]}} \quad [3]$$

Thus having $RMS_1$, $RMS_2$, ($f_c$, digital) and ($f_c$, analog), one can once again calculate the ratio x and based on that ratio and other receiver parameters, gains for the RF and baseband circuitry may be set. As a special case, consider when there is no other channel except the wanted channel within the bandwidth of the wideband analog filter (i.e., x=∞). In this case, $RMS_2=RMS_1$. Hence, there is only one signal present, which has a large ADC dynamic range at its disposal.

Thus in various embodiments, the AGC algorithm seeks to optimize the ADC dynamic range for all possible spectral profiles, while also taking the possibility of the existence of sub-band blockers into consideration.

Figure 5:
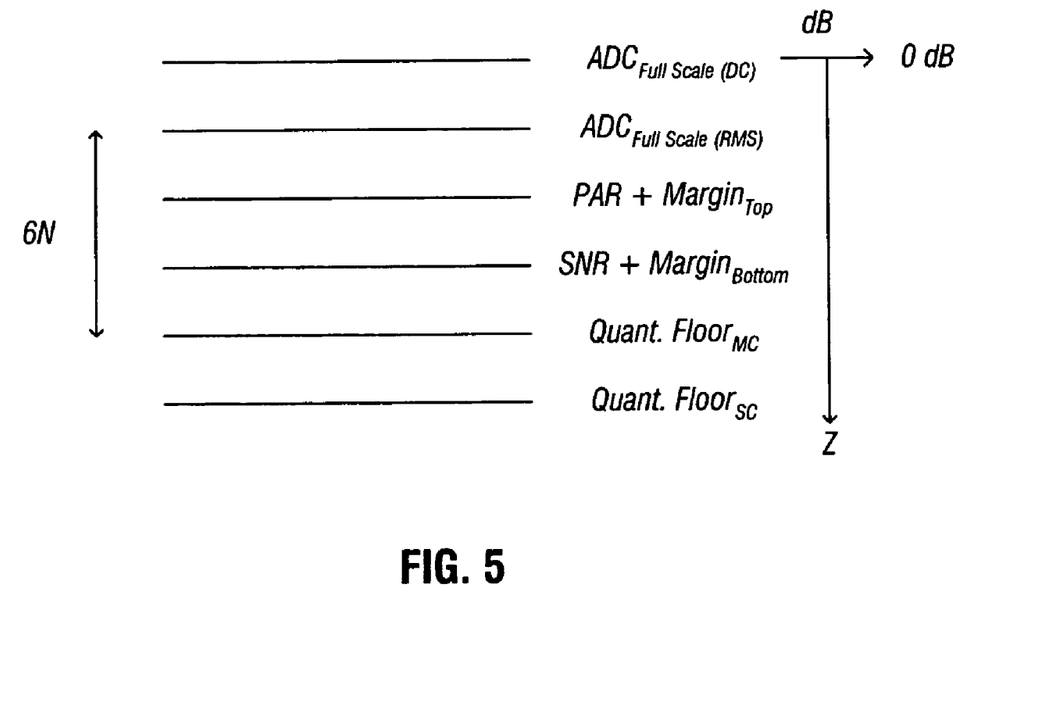
FIG. 5 is a graphical representation of an analog-to-digital converter (ADC) dynamic range along with other power levels in accordance with an embodiment of the present invention.

To explain the algorithm further, refer now to FIG. 5 which shows an ADC dynamic range allocation and related thresholds. Note that FIG. 5 is not drawn to scale. Assume an ADC having N bits, whose dynamic range, defined as the full-scale RMS ($ADC_{Full\ Scale\ (RMS)}$) -to-quantization noise RMS (Quant. $Floor_{MC}$), corresponds to 6N dB. For example, for an 8-bit ADC, the dynamic range is 48 dB. Note that in FIG. 5, the ADC full-scale DC level ($ADC_{Full\ Scale\ (DC)}$) is 3 dB higher than the ADC full-scale RMS level (i.e., $ADC_{Full\ Scale\ (RMS)}$). If the signal presented to the ADC is greater than the full-scale DC value, clipping occurs and signal information is lost. If instead, the signal input to the ADC is below the quantization floor, information is lost within the noise level of the ADC. Accordingly, the gain of one or more front-end stages may be controlled to maintain the signal input to the ADC between its full-scale value and the quantization floor.

FIG. 5 also shows additional power levels. Specifically, FIG. 5 shows a single channel noise floor, Quant. $Floor_{SC}$, which is the quantization noise within the bandwidth of the wanted signal. In an implementation having a ADC full-scale of 0 dB, this noise floor may correspond to:

$$-(6N+3)-10 \log fs/2f_c, dig \quad [4]$$

where fs is the sampling frequency of the ADC. Note that the quantization noise for the multi-channel signal is $-(6N+3)$ dB down from the 0 dB $FS_{DC}$ value.

As further shown in FIG. 5, a peak-to-average ratio (PAR) for the signal, which may correspond to a ratio between the peak-to-average incoming signal, may be set to a value lower than the DC fill-scale value of the ADC, to avoid clipping. Thus as shown in FIG. 5, this threshold level may be set at a value of $-(PAR+Margin_{top})$ where $Margin_{top}$ is a predetermined threshold below the PAR value. In certain implementations, PAR may correspond to a value of between approximately 10 to 14 dB, however the scope of the present invention is not so limited.

In various embodiments, the AGC algorithm may seek to set gain levels such that a ratio of the first power level (i.e. $RMS_1$) to the full-scale ADC value, and more specifically, a ratio of the power level to the DC full-scale value, also referred to herein as the AGC target level, is within the dynamic range of the ADC, i.e., $$\frac{RMS_1}{FS_{DC}} = -(PAR + Margin_{top}) \text{ dB} \quad [5]$$

This ratio ensures that the incoming signal to the ADC is (virtually) completely within the full-scale range of the ADC. In other words, the average incoming power is within the ADC range, for example, 99.6% of the time. Then, a ratio between the second power level (i.e., $RMS_2$) and the ADC full-scale value may be determined. Specifically, this second ratio, $RMS_2/FS_{DC}$, may be determined. Furthermore, the AGC algorithm may adjust the gain if this second ratio is not at least a predetermined amount above the quantization noise floor. Specifically, the AGC algorithm may determine whether this second ratio is greater than the noise floor plus a predetermined margin. In other words, the AGC algorithm may determine whether:

$$20\log\left(\frac{RMS_2}{FS_{dc}}\right) = -(6N+3) - 10\log\frac{fs}{2fc, dig} + SNR_{dB} + Margin_{bottom} \quad [6]$$

where SNR is a required signal-to-quantization noise ratio to have a certain impact on system performance.

Thus, the algorithm may continually monitor both $RMS_1$ and $RMS_2$ to attempt to ensure that the following constraints are met:

$$20\log\left(\frac{RMS_1}{FS_{dc}}\right) \leq -PAR \quad [7]$$

and $$20\log\left(\frac{RMS_2}{FS_{dc}}\right) \geq -(6N+3) - 10\log\frac{fs}{2fc, dig} + SNR \quad [8]$$

where fs is the ADC sampling rate and fc,dig is the digital filter corner frequency. Note that these and following equations may correspond to power levels (in dB), although not explicitly shown as such in the equations. In one example, the fs may be 200 MHz, and the SNR may be 25 dB. Usually, there is margin to spare both for Equations 7 and 8 such that there is range for $RMS_1$ where both inequalities are satisfied if all the channels are equi-power.

Assume that in this case, $RMS_1$ is set such that:

$$20\log\left(\frac{RMS_1}{FS_{dc}}\right) = -(PAR_{dB} + Margin_{Top}) \quad [9]$$

Further assume that for equi-power channels and the $RMS_1$ level set by Equation 9:

$$20\log\left(\frac{RMS_2}{FS_{dc}}\right) = -\left((6N+3) - 10\log\frac{fs}{2fc, dig} + SNR_{dB} + Margin_{bottom}\right) \quad [10]$$

Thus, both the single channel of interest as well as the output of the wideband analog filter are within the dynamic range of the ADC, allowing minimal bit error rates (BER).

Figure 6:
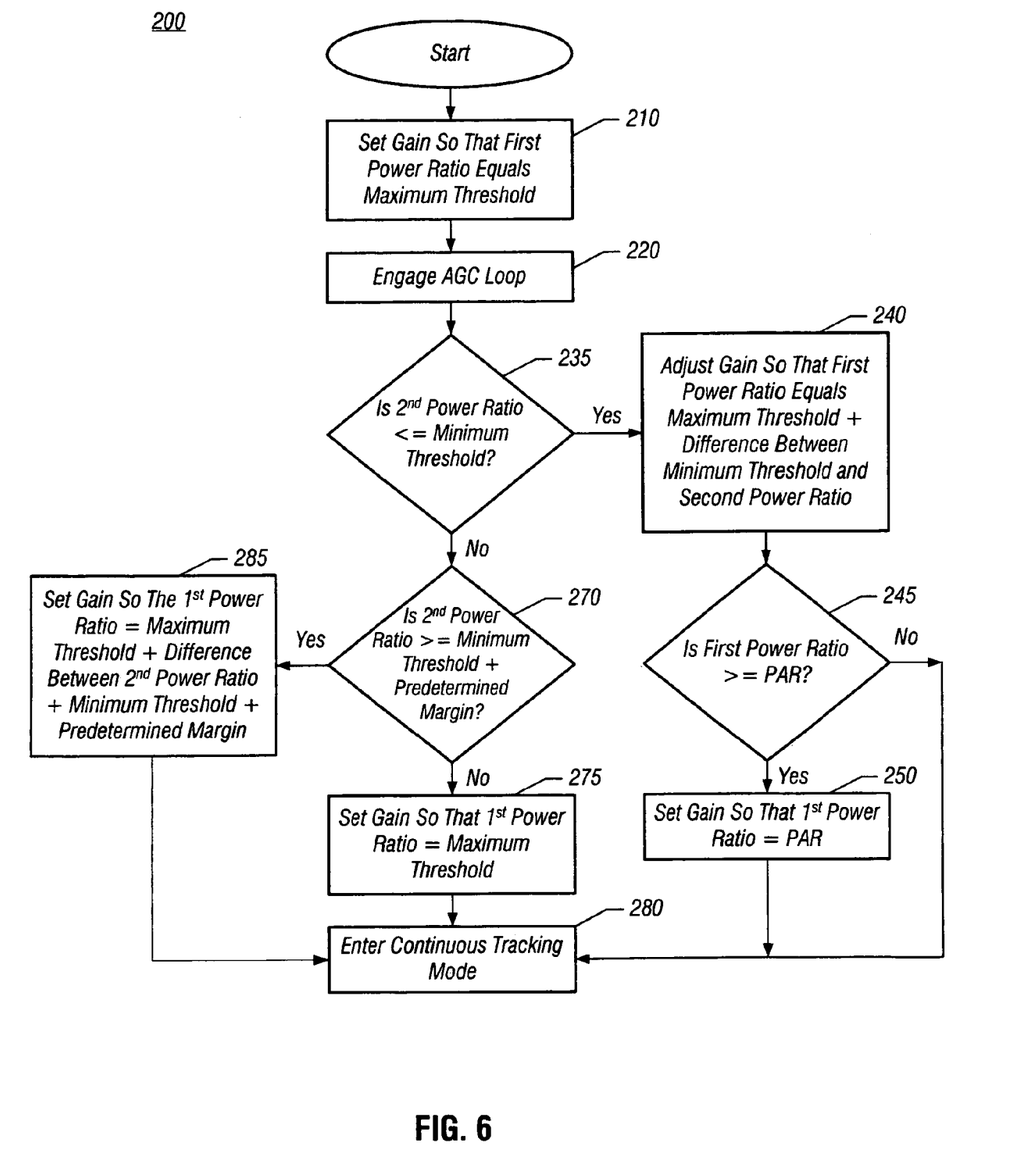
FIG. 6 is a flow diagram of a method in accordance with one embodiment of the present of invention.

Referring now to FIG. 6, shown is a flow diagram of a method in accordance with one embodiment of the present invention. Specifically, method 200 may be used to set a gain for one or more gain stages of a satellite receiver. As shown in FIG. 6, method 200 may begin by setting a gain level so that a first power ratio equals a maximum threshold (block 210). Gain levels may be set for a number of gain stages, such as a LNA and front-end analog signal amplifiers, such as PGAs. The maximum threshold may correspond to a full-scale level of the ADC, backed off by a predetermined margin. For example, the first power ratio, which may be a ratio of the measured power out of the wideband analog filter (i.e., $RMS_1$), may be set such in accordance with Equation 9, above.

After setting the gain in this manner, the AGC loop may be entered and the receiver may settle (block 220). Next, it may be determined whether a second power ratio is less than or equal to a minimum threshold (diamond 235). In various embodiments, the second power ratio may correspond to a ratio of the power level of the signal of interest to the ADC full-scale. Furthermore, the minimum threshold may correspond to the quantization noise within the bandwidth of the wanted signal. In one embodiment, this inequality may correspond to:

$$20\log\left(\frac{RMS_2}{FS_{dc}}\right) \leq -(6N+3) - 10\log\frac{fs}{2fc, dig} + SNR \quad [11]$$

If it is determined that this second power ratio is below the minimum threshold, the gain may be adjusted so that the first power ratio equals the maximum threshold plus the difference between the minimum threshold and the second power ratio (block 240). In other words, the gain may be increased by the amount that the second power ratio is below the quantization noise floor. With reference to the described embodiment, the AGC target level may be set to:

$$20\log\left(\frac{RMS_1}{FS_{dc}}\right) = -(PAR + Margin_{Top}) + \left[-(6N+3) - 10\log\frac{fs}{2fc, dig} + SNR - 20\log\frac{RMS_2}{FS_{dc}}\right] \quad [12]$$

Next, it may be determined whether the first power ratio at the adjusted gain level is greater than or equal to PAR (diamond 245). In other words, the algorithm may determine whether clipping in the ADC is occurring. Thus, in the described embodiment it may be determined whether:

$$20\log\left(\frac{RMS_1}{FS_{dc}}\right) \geq -PAR \quad [13]$$

If the first power ratio is below PAR, control may pass to block 280, where the algorithm enters into a continuous tracking mode (block 280). If instead at diamond 245, it is determined that the first power ratio is greater than or equal to PAR, control may pass to block 250. There, the gain may be set so that the first power level equals PAR (block 250). Thus, in the described embodiment:

$$20\log\left(\frac{RMS_1}{FS_{dc}}\right) = -PAR \quad [14]$$

Then, from block 250 control passes to block 280, as discussed above.

Still referring to FIG. 6, if at diamond 235 it is determined that the second power ratio is greater than the minimum threshold, control passes to diamond 270. There, it may be determined whether the second power ratio is greater than or equal to the minimum threshold plus a predetermined margin (diamond 270). More specifically, this inequality may determine whether the second power ratio is within a selected margin of the noise floor. In the described embodiment, this inequality may correspond to:

$$20\log\left(\frac{RMS_2}{FS_{dc}}\right) \geq -(6N+3) - 10\log\frac{fs}{2fc, dig} + SNR + Margin_{top} + Margin_{bottom} \quad [15]$$

If the second power level is greater than or equal to the noise floor as augmented by the desired margin, control passes to block 285. There, the gain level may be set such that the first power level equals the maximum threshold plus the difference between the second power ratio and the minimum threshold plus the predetermined margin. In other words, the AGC target level may be set such that the gain level is backed off of the maximum threshold by an amount that the power level of the desired channel is above the noise floor. In the described implementation, the AGC target level may be set as follows:

$$20\log\left(\frac{RMS_1}{FS_{dc}}\right) = -(PAR + Margin_{Top}) - \left[20\log\frac{RMS_2}{FS_{DC}} - \begin{array}{l}-(6N+3) - 10\log\frac{fs}{2fc, dig} + \\ SNR + Margin_{top} + Margin_{bottom}\end{array}\right] \quad [16]$$

Then, control passes to the continuous tracking mode of block 280, as discussed above.

Finally, with reference to FIG. 6, if at diamond 270 it is determined that the second power ratio is less than the minimum threshold and the predetermined margin, the gain may be set such that the first power ratio equals the maximum threshold. In other words, when the channel of interest is below the noise floor, the gain may be set to a maximum such that the multi-channel ADC output is not in a clipping range. In the described embodiment, the first power ratio may be set as follows:

$$20\log\left(\frac{RMS_1}{FS_{dc}}\right) = -(PAR + Margin_{top}) \quad [17]$$

Then, control passes from block 275 to block 280.

In such manner, embodiments of the present invention may improve the quality of an AGC algorithm by optimizing an AGC target level based on information provided by both a narrowband and wideband power detector. Accordingly, the available dynamic range of an AGC may be used in an optimal manner. In this way, the overall quality of a receive chain (and particularly its BER) may be improved under a linearity constraint as well as a noise constraint.

Figure 7:
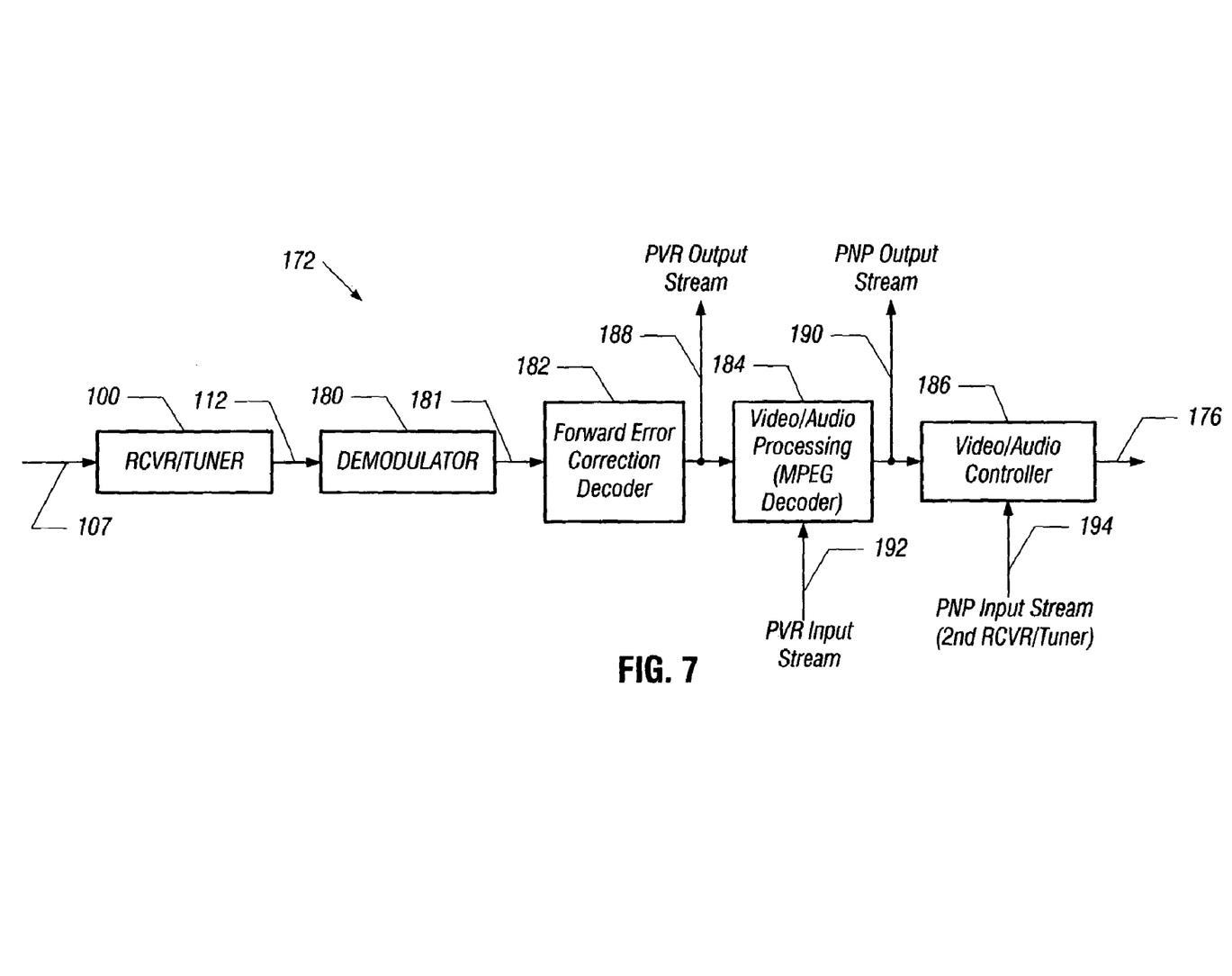
FIG. 7 is a block diagram of a system in accordance with one embodiment of the present invention.

FIG. 7 is a block diagram of a system in accordance with one embodiment. As one example, system 172 may be a satellite set-top box that includes receiver circuitry 100, which corresponds to receiver circuitry 10 as shown in FIG. 1. Of course, embodiments of the present invention may be used in connection with other systems. An input signal spectrum 107 can be, for example, 32 transponder channels between 950 MHz and 2150 MHz with each transponder channel carrying a number of different program channels. This signal spectrum 107 can be processed by the receiver/tuner 100 to provide digital baseband output signals 112 that represent a tuned transponder channel. These output signals 112 can then be processed by a demodulator 180 that can tune one of the program channels within the tuned transponder channel. The output signal 181 from the demodulator, which represents a tuned program channel within the transponder channel that was tuned by the receiver/tuner 100, can then be processed with a forward error correction decoder 182 to produce a digital output stream. This digital output stream is typically the data stream that is stored by personal video recorders (PVRs) for later use and viewing by a user, as represented by the PVR output stream 188. The output of the decoder 182, or the stored PVR data as represented by PVR input stream 192, can then be processed by video/audio processing circuitry 184 that can include processing circuitry such as an MPEG decoder.

The output of the processing circuitry 184 is typically the digital video data stream that represents the program channel and is used for picture-in-picture (PnP) operations, for example, where system 172 includes two tuners with one tuner providing the primary viewing feed and a second tuner providing the PnP viewing feed. The output of the processing circuitry 184, as well as a PnP input stream 194 from a second tuner if a second tuner is being utilized for PnP operations, can be processed by a video/audio controller 186 to generate a video output signal 176 that can subsequently be utilized, for example, with a TV or VCR. Additional tuners could also be used, if desired.

The methods described herein may be implemented in software, firmware, and/or hardware. A software implementation may include an article in the form of a machine-readable storage medium onto which there are stored instructions and data that form a software program to perform such methods. As an example, a DSP may include instructions or may be programmed with instructions stored in a storage medium to perform gain control in accordance with an embodiment of the present invention.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
digitally detecting a first signal strength corresponding to a multi-channel spectrum of an incoming radio frequency (RF) spectrum;
digitally detecting a second signal strength corresponding to a selected channel of the incoming RF spectrum; and
controlling at least one gain stage based on the first signal strength and the second signal strength, including setting a first target level for a first ratio of the first signal strength to an analog-to-digital converter (ADC) full-scale value, controlling the at least one gain stage to attain the first target level, determining a second ratio of the second signal strength to the ADC full-scale value at the first target level, and setting a second target level for the first ratio if the second ratio is less than a predetermined threshold.

2. The method of claim 1, wherein detecting the first signal strength comprises detecting a root mean square value of an output of the ADC.

3. The method of claim 2, wherein detecting the second signal strength comprises detecting a root mean square value of an output of a digital filter coupled to the output of the ADC.

4. The method of claim 1, further comprising adjusting the at least one gain stage based on the second ratio.

5. The method of claim 1, further comprising controlling the at least one gain stage such that the first ratio is less than a peak-to-average ratio and the second ratio is greater than a difference between a target signal-to-noise ratio and a quantization noise floor of the selected channel.

6. An apparatus comprising:
an analog receiver path to receive an incoming radio frequency (RF) signal spectrum and to generate a multi-channel conditioned signal, and including an analog-to-digital converter (ADC) to convert the output of a wideband analog filter to the multi-channel conditioned signal;
a digital receiver path coupled to the analog receiver path to process the multi-channel conditioned signal to obtain a single channel digital signal;
a first power detector coupled to measure a first power level corresponding to the multi-channel conditioned signal;
a second power detector coupled to measure a second power level corresponding to the single channel digital signal; and
a controller to control at least one gain stage of the apparatus based on the first power level and the second power level, the at least one gain stage based on a first ratio between the first power level and a full scale value of the ADC and a second ratio between the second power level and the full scale value.

7. The apparatus of claim 6, wherein the first power detector and the second power detector comprise root mean square detectors.

8. The apparatus of claim 6, wherein at least the analog receiver path and the digital receiver path are integrated within the same integrated circuit.

9. A system comprising:
a first gain stage to receive an incoming radio frequency (RF) spectrum and to apply a gain to the incoming RF spectrum;
an analog filter coupled to the first gain stage to generate a wideband filtered signal from the incoming RF spectrum;
an analog-to-digital converter (ADC) coupled to the analog filter to convert the wideband filtered signal into a digital signal;
a first detector coupled to the ADC to detect a strength of the digital signal; a digital filter coupled to the ADC to generate a narrowband filtered signal from the digital signal;
a second detector coupled to the digital filter to detect a strength of the narrowband filtered signal; and
a controller to control the first gain stage based on the strength of the digital signal and the strength of the narrowband filtered signal, so that a power level of a selected channel within the incoming RF spectrum is at least a minimum predetermined amount above a quantization noise level for the ADC.

10. The system of claim 9, wherein the controller is to set the first gain stage at a level such that a first ratio of the strength of the digital signal to a full scale value of the ADC corresponds to a predetermined value.

11. The system of claim 10, wherein the controller is to determine if a second ratio of the strength of the narrowband filtered signal to the full scale value is greater than a predetermined threshold, wherein the first ratio corresponds to the predetermined value.

12. The system of claim 11, wherein the controller is to adjust the first gain stage if the second ratio is less than the predetermined threshold.

13. The system of claim 9, wherein the first gain stage comprises at least one programmable gain amplifier and the system comprises a satellite receiver.

14. The system of claim 9, wherein the controller is implemented in a digital signal processor (DSP).

15. The system of claim 14, wherein at least the DSP, the analog filter, and the ADC are integrated on a single substrate.

* * * * *